United States Patent [19]
Erb et al.

[11] 4,131,900
[45] Dec. 26, 1978

[54] PRINTING APPARATUS

[75] Inventors: Hans Joachim Erb, Gotzenhaim; Jurgen Brandt, Frankfurt am Main; Peter Kirschbaum, Bad Vilbel, all of Fed. Rep. of Germany

[73] Assignee: Hartman & Braun Aktiengesellschaft, Frankfurt am Main, Fed. Rep. of Germany

[21] Appl. No.: 805,648

[22] Filed: Jun. 13, 1977

[30] Foreign Application Priority Data

Jun. 15, 1976 [DE] Fed. Rep. of Germany ....... 2626682

[51] Int. Cl.² .................... G03G 17/00; G01D 15/08; G01D 7/02
[52] U.S. Cl. .................................. 346/162; 346/35; 346/23
[58] Field of Search ................... 346/162, 163, 23, 34, 346/35

[56] References Cited

U.S. PATENT DOCUMENTS

| | | | |
|---|---|---|---|
| 2,847,268 | 8/1958 | Cowper | 346/35 |
| 2,919,171 | 12/1959 | Epstein | 346/162 |
| 3,465,360 | 9/1969 | Hackley | 346/35 |
| 3,553,711 | 1/1971 | Kurimura | 346/35 |
| 3,579,247 | 5/1971 | Minohara | 346/35 |
| 3,599,227 | 8/1971 | Cobb | 346/162 |
| 3,605,109 | 9/1971 | Tyler | 346/34 |
| 3,704,468 | 11/1972 | Ohta et al. | 346/34 |
| 4,040,063 | 8/1977 | Berglund | 346/23 |

*Primary Examiner*—Jay P. Lucas
*Attorney, Agent, or Firm*—Smyth, Pavitt, Siegemund, Jones & Martella

[57] ABSTRACT

A printing apparatus for multiple signal printout has separate multiplexers for analog and pulse channels. The multiplexed analog signal is digitized, formatted, and applied via a selector to an adder, alternatively and selectively, the pulses are applied as digital signals to the adder. The adder receives zero offset numbers which differ for the different channels and the resultant numbers are applied to a one-out-of-n decoder driving printing electrodes. The system is under control of a cyclically addressed ROM whose outputs controls the multiplexing and furnishes the offset numbers. A clock sequencer times each acquisition frame.

8 Claims, 1 Drawing Figure

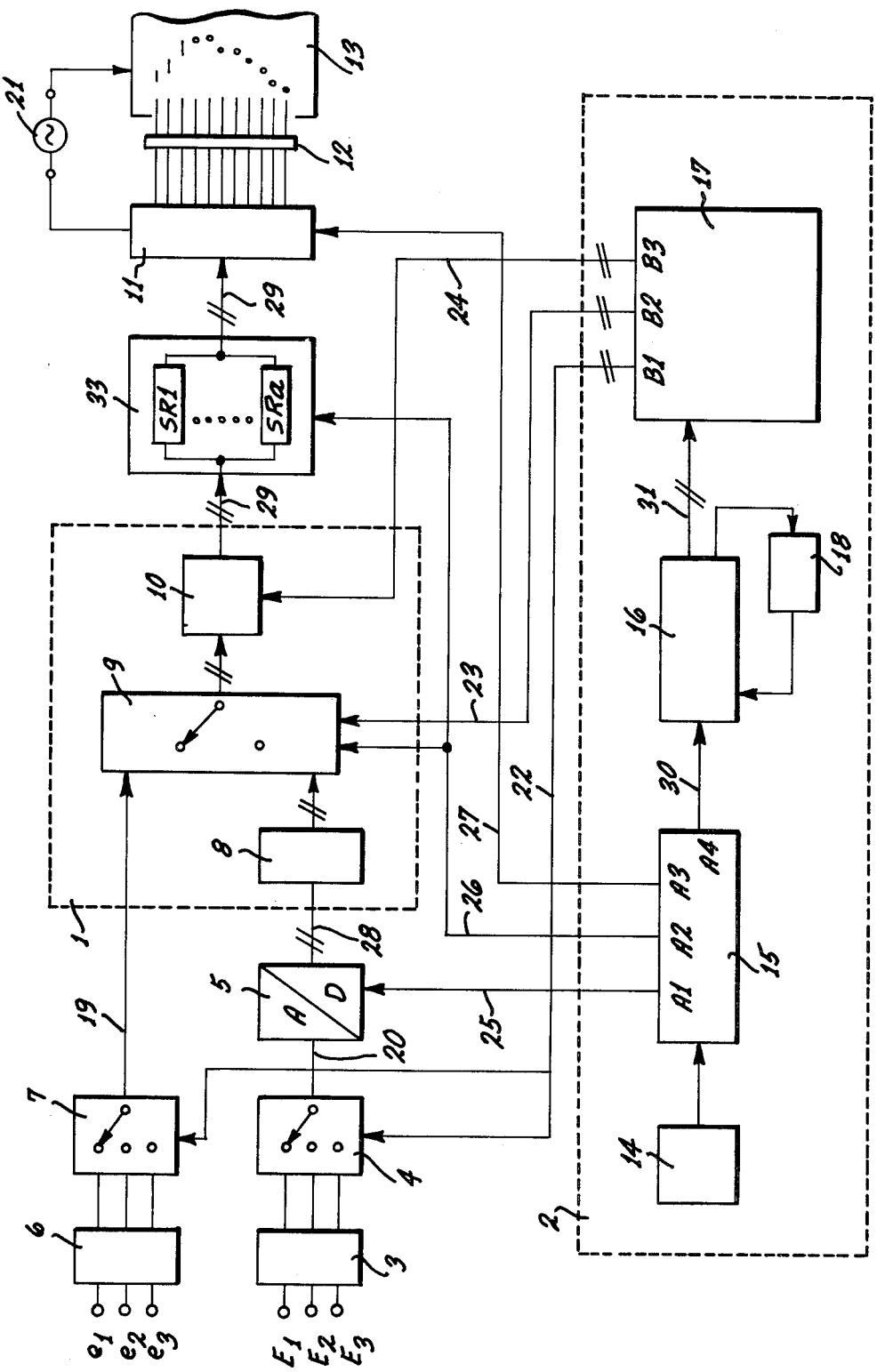

PRINTING APPARATUS

BACKGROUND OF THE INVENTION

The present invention relates to printing apparatus, and more particularly, the present invention relates to multi-element dot printers or the like for recording information, for example, on metallized paper strips.

Plotters, writers, printers, of the type to which the invention pertains in the general sense may include, for example, a measuring instrument which receives the signal or value to be recorded, and the instrument has a pointer constructed as an electrode. The electrode is in contact with paper having a metallized backing, and upon application of a voltage between the electrode-pointer and the metallization, the pointer will burn a dot or a trace into the paper. The paper advances in a particular direction and the pointer undergoes a deflective movement with a component generally perpendicular to the direction of movement of the paper; thus, a time-amplitude curve composed of dots is "burned" into the paper in that manner. Particular recording devices may include relays, the armature of which carries such a pointer serving as an electrode. Normally, the electrode is disengaged from the paper. If a particular event, disturbance, alarm condition or the like occurs, the relay responds and deflects the pointer by a few millimeters and a recording will be made. Error or interference recorders of that type may require a number of variants, particularly in view of the number of measuring points to be supervised in that manner. Another variable is, of course, the width of the recording strip, and the association of the various pointers with the different measuring points, alarm conditions, etc. Equipment of this type often requires, in addition, a somewhat flexible distribution between the various locations and test points on one hand, and the particular input channels of the recorder on the other hand. The variations here may well require different overall construction of a particular type recorder so that a particular multi-channel and/or multi-purpose recording device may have to be assembled in accordance with the particular intended use of employment. Moreover, a change from one type of equipment to another type of equipment is often not possible once a particular assembly has been completed.

Utilization of a fixed recording system is, of course, desirable, having a number of comb-like arranged electrodes. By way of example, 256 comb prongs and electrodes may be included here with a total recording width of about 120 millimeters. Rather expensive recorders and special relays may be avoided in such an instance, if this particular comb arrangement cooperates with equipment which selectively associates measuring values with particular electrodes. On the basis of such a principle, a generalized piece of equipment can be realized if it is possible to preprocess the various measuring values in such a manner so that, indeed, the various electrodes are always directly operated by the associating equipment. Such a generalized or universal equipment system may well be suited for obtaining different kinds of recordings and permissing employment under different conditions and for different purposes as far as plotting, recording, etc., in general is concerned.

The German printed patent application No. 1,798,058 discloses a recorder with at least two input channels receiving signals to be recorded. Each channel includes an analog to digital converter which converts the analog signal in the respective channel into a binary, i.e., multi-bit signal. This particular recorder includes, in addition, a multiplexer which feeds the binary data from the input channels to a decoding matrix. This particular associating device decodes the binary values and energizes selectively one of a plurality of electrodes. The electrodes are arranged across an electrographic strip. This way, the signals are plotted one after the other. The delay between two sequential recording pulses is only a fraction of a second so that all signals are practically simultaneously recorded in the form of a row of dots. The delay in-between the recording of any two dots is practically zero. However, it was found to be disadvantageous that each channel requires its own analog-to-digital converter. Since in this particular recorder each signal is recorded practically over the entire recording width of the strip, the number of signals that can be recorded concurrently is inherently limited unless the various recordings interfere, which, of course, is to be avoided.

DESCRIPTION OF THE INVENTION

It is an object of the present invention to provide a new and improved multichannel recorder.

In accordance with the preferred embodiment of the present invention, it is suggested to provide the following combination system for purposes of recording information represented in a plurality of different input channel signals. The recording device is to include a multiplexing means in the general sense, for sequentially scanning the input channels of the plurality whereby preferably the multiplexing means is comprised of two multiplexers operating independently from each other, one being connected to those input channels which provide pulse signals while the second multiplexer sequentially interrogates the input channels which provide analog signals. The latter multiplexer has its output connected to a analog-to-digital converter, and the output of that converter, on one hand, together with the multiplexer for the pulse channel, is fed to an addressable selection circuit whose output is either a pulse signal from one of the pulse channels or a digitized analog signal. This latter selector constitutes in a general sense the output of the multiplexing means, and that output is connected to an adder in which each digital number is augmented by a selected fixed number. This way, a zero offset is provided for each channel so that each channel becomes associated with a particular amplitude and strip width range within which the information is to be confined. The adder output is connected to a one-out-of-n decoder which drives printing elements such as individual electrodes for burning dots, for example, into metallized paper if used as recording medium. The operation is preferably under control of a program means which includes a program counter sequentially accessing locations in a ROM, and the information read from the ROM is used to control the acquisition process such as accessing and switching the multiplexing means, providing for the distinction between the pulse and analog channels, and providing the number to be added by the adder to the digitized information. The program means includes, in addition, a timer which runs the program counter and, within each acquisition frame time, the timer sequences the operation of the multiplexing, of the A/D conversion, of the selection operation, of the adder operation, and of the printing. The output of the analog-to-digital converter is preferably formatted into a number of bits per digitized input signal in accordance with the width of the strip portion defining the amplitude range available for recording each of the signals. In special cases, it may be advisable to interpose a delaying buffer between the adder and the one-out-of-n decoder.

DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

The FIGURE illustrates a block diagram of a recording device in accordance with the embodiment of the present invention.

Proceeding now to the detailed description of the drawing, the FIGURE shows by way of example six input channels denoted $e_1$, $e_2$, $e_3$, and $E_1$, $E_2$, $E_3$. Each of these channels $E_1$, $E_2$, $E_3$, receives analog signals which represent measuring values and signals extracted from different transducers appropriately positioned. The channels $e_1$, $e_2$, $e_3$, receive pulse trains which may be bit streams.

Reference numeral 3 refers to amplifier means which may include impedance matching, and gain adjusting equipment and devices, separately for each of the channels $E_1$, $E_2$, and $E_3$, to change the range of signals so that all of these signals vary over a particular range of voltages. For example, the signals each may be normalized so that their amplitudes vary only between, for example, zero and one volt. Analogously, a level adaptor 6 normalizes the pulse trains from the channels $e_1$, $e_2$, $e_3$. to obtain a uniform signal amplitude range in all three instances.

Reference numeral 4 refers to a scanning and multiplexing device which scans the individual analog channels $E_1$, $E_2$, and $E_3$, as normalized by circuit 3 and provides a sequence of analog signals in accordance with the scanning rate, and to be set into an output channel 20. Analogously, scanner and/or multiplexer 7 interrogates the normalized pulse signal channels and provides a sequence of high and low signals into a channel 19.

The multiplexers 4 and 7 operate in response to address signals B1 which they receive from a bus 22. Each of the multiplexers 4 and 7 has its own address continuum or range to which it responds. Conceivably, the multiplexers 4 and 7 are addressed alternatingly to double the permissible signal settling time vis-a-vis the overall scanning rate. The address signals on bus 22 (having three lines in this example) originate in a ROM 17 which is by itself addressable in a manner to be described later. This ROM 17 has several output busses, and the particular bus 22 receiving address signals B1 is one of them. This way, one obtains individually a particular connection between one of the measuring channels $E_1$, $E_2$, $E_3$, and the channel 20, and between one of the pulse channels $e_1$, $e_2$, $e_3$. and the output line 19.

The analog signal in line 20 is fed to an analog-to-digital converter 5, whereby it must be understood that the signal in line 20 is, in fact, a multiplex signal. The multichannel output of the converter 5 is denoted by reference numeral 28. Lines 19 and 28 lead into a signal processing stage 1 which in the following will simply be referred to as SPS 1. SPS 1 includes a record formatting device 8, a selection circuit 9, and an adder 10. The devices 4, 7, and 9, together actually constitute a multiplexing means providing a single but digital output signal train for the six input channels. SPS 1 has the task of associating the input signals as derived from the analog-to-digital converter 5 with a particular recording width as well as with a particular starting value (zero offset). Ultimately, the signals will be recorded on a metallized recording paper strip 13. The system includes a programming and control circuit 2, having an osciallator or clock 14, driving a clock circuit 15, from which a plurality of clock signals can be derived. One of the clock signals is denoted as A1, and this particular clock signals is fed via a clock line 25 to the analog-to-digital converter 5. The pulse line 19, of course, does not require any conversion into binary code. It should be mentioned moreover that it is practical to select the amplitude normalization in the pulse channel provided by the circuit 6 so that the amplitude of the pulse train in line 19 is the same as the amplitude of the bit signals in the multi-line bus 28. This way, circuit SPS 1 will operate at a uniform signal level.

The digitalized measuring values are formatted by the device 8 in a manner to be described below. Briefly, converter 5 may be a standarized 10-bit device, while device 8 is unique to the specific equipment and its purpose is to reduce the number of bits processed further. The formatted digitized measuring signals are applied to selection circuit 9; the same is true with regard to the multiplex pulses from line 19. The selection device 9 is operated by a single bit B2, furnished by ROM 17, and applied by a single line bus 23 to the device 9 to connect one or the other of the inputs of the device 9 to a common output. Device 9 itself may actually have a buffered output (register) so that any signal it selects for further transfer, be it a single bit (pulse) or a digitized measuring signal, is applied to that buffer and set into it by another clock signal from sequencer 15 via a clock line 26. Conceivably, a single bit from line 19, if a "one" (= pulse) may be set into a particular buffer stage. The selection of that stage will be discussed below.

The buffer output is applied to adder 10 which adds a particular number B3 to whatever digital signal it receives from the buffered selection circuit 9. That number B3 is always the same for signals from the same input channel, but differs for the various measuring channels. The numbers B3 are also taken from the ROM 17 whose output applies them via the multi-line bus 24 to the respective second input of the adder 10. Therefore, the adder 10 provides digital numbers in which a binary value representing the normalized, formatted measuring signal from any of the channels $E_1$, $E_2$, $E_3$, has been augmented by a particular fixed number as to each channel representing a zero off-set. As to channels $e_1$, $e_2$, $e_3$, adder 10 adds the respective offset number to zero (low signal) in line 19, or to the number represented by the particular stage of the buffer in 9 to which line 19 is connected.

The multi-line channel 29 connects to adder 10 to a one-out-of-n decoder 11. The interpositioning of a buffer 33 does not have to be considered at the present time. This particular decoder has as many outputs as an electrode comb 12 has electrodes. The decoder 11 energizes just one particular electrode of the comb 12 at a time and which, in fact, is defined by the digital signal as applied to the decoder 11 via the input channel 29. By way of example, n may be 512 so that, counting from one end, a number zero applied to the decoder 11 energizes the first electrode, a number such as 174 applied to decoder 11 energizes the 175th electrode.

The output of the decoder 11 is clocked via line 27 by a particular phase clock pulse A3 from sequencer 15 so that the particularly selected electrode receives an energizing signal of a very short period of time only, for example, 50 microseconds, being the pulse width of the clock pulse. This is, in effect, the printing time for one particular dot. The required voltage is derived from the source 21 and is accordingly applied for 50 microseconds between the selected electrode and the back metallization of the recording strip 13. Source 21 is connected with one pole to the paper metallization and the other pole connects to circuit 11.

Speaking generally, an acquisition frame is accomplished by the following sequence of operation. A set of addresses B1, B2, and a number B3 appears at the output of ROM 17. The address B1 operates one of the multiplexers to select the next input channel for a measuring value or a pulse channel. If settling is critical, then B1 may actually pertain to the next channel. The address B2 sets the selector 9. Each recording step is operated in phase synchronism with the sequence of clocks A1, A2, and A3, being generated in the timing and sequencing device 15. The clocks A1, A2, and A3, all have the same rate but their phases differ in that A2 follows A1, and A3 follows A2 in cyclic repetition. A clock A1 establishes and times the digitization, the selector 9 has already been shifted to the selected multiplexer, and clock A2 sets the selected channel signal into the buffer of selector 9 to obtain operation by adder 10, having available the appropriate number B3 to be added. Clock A3 follows shortly to cause energization of one particular printing electrode, depending upon the result of the addition and following the one-out-of-n decoding in 11.

The clock circuit and timer 15 provides still another clock signal, denoted with A4, which controls and times presentation of the next set of numbers B1, B2, and B3, in the following manner. Reference numeral 16 refers generally to an address counter 16 which receives clock pulses A4 via clock line 30. Each acquisition and printing frame can be defined as the events beginning from the acquisition of a measuring value up to its printing; the clock signals A4 are the last one within each such frame period. The counter 16 is updated, therefore following each printing event. The count state signal from the counter 16 is applied to an address bus 31 which accesses a particular location in the ROM 17, being a multi-bit location, and holding the numbers and codes B1, B2, and B3 (a simplification will be discussed shortly). The counter 16 may have maximum capacity which, in fact, defines the maximum number of measuring channels which can be processed in this manner. Customerization may require a lesser number of channels. This number is detected by a decoder 18 causing the counter to recycle when the decoder circuit 18 responds and resets the counter.

The counter 16 can be correctly called a program counter because it runs cyclically through a number of count states and thereby sequentially accesses locations in ROM 17 each of which contains the three commands B1, B2, and B3, which are associated with a particular count state which, in turn, is associated with a particular channel. The numbers B1, B2, B3, define the specific operations to be carried out for the acquisition and final printing of the information of one channel as acquired during one frame. In particular, each program-count-addressed-ROM location contains the command B2 for the selection of one particular multiplexer as input for circuit 9, and it contains the number B3 which is a base or starting value or an offset zero number to be added as a base or zero offset to any digital number which has been acquired from one particular data channel. The number B1, being the multiplex address number that sets one or the other of the multiplexers 4, 7, could also be stored in the ROM. However, it is simply more convenient and economical to use here the count numbers from 16, because these count numbers do, in fact, identify the respective input channels. Thus, bus 31 will not only be connected to the address decode circuitry in ROM 17, but bus 22 will, in addition, be connected directly to bus 31.

| Channel | Example: $n = 256 = 2^8$ | | | |
| --- | --- | --- | --- | --- |
| | Counter 16 (= Bl) | B2 | B3 | |
| e/1 $E_1$ | 000 | 0 | 00 000 000 | |
| e/2 $E_2$ | 001 | 0 | 01 001 101 | (= 85) |
| e/3 $E_3$ | 010 | 0 | 10 011 010 | (= 154) |
| E/1 $e_1$ | 011 | 1 | 11 100 111 | (= 231) |
| E/2 $e_2$ | 100 | 1 | 11 101 111 | (= 239) |
| E/3 $e_3$ | 101 (recycle) | 1 | 11 110 111 | (= 247) | in this example the information scale is limited to eight bits. The zero line of the pulse channels $e_1$, $e_2$, $e_3$ will be recorded by the 232th, 240th, 248th electrode. The pulses themselves will be plotted by in-between electrodes depending upon the effective connection of the line 19, via selector 9, to one particular input line for the adder 10. The zero line of the signal channels $E_1$, $E_2$, $E_3$ will be recorded by the 1st, 86th, 155th electrode. As the curves plotted are not to overlap or intersect, the numbers B3 should be chosen, in fact, as record strip divider, and the formatter 8 will reduce the resolution of the signals to a number of bits, so that each signal plus zero offset number remains always below the next higher zero offset number for another channel. It can also be seen that in the case of signals that vary polarity, the zero offset number should have a value corresponding to a recording electrode in about the middle of the strip alotted for recording.

In this particular example one will need a ROM 17, having an address bus 31 of three lines; the counter 16 runs from 0 to 5 and recycles. In additon, each ROM location, thus accessed, has nine locations to the bit level, and accordingly, the data output bus composed of the sub-busses 22, 23 and 24, consists of twelve data lines; nine lines lead out of the accessed location, i.e. constitute the data-out bus proper and encompass the two busses 23 and 24. Three additional lines (22) are derived via gating and branching structures in ROM 17, gating the address on address bus 31 into lines 22.

Upon accessing a particular location in ROM 17, the specific data, as shown by way of example in one row in the table above, are applied to the bus 22-23-24. These data appear specifically after a particular clock pulse A4 occurred, and which was produced at the end of the preceding frame. Subsequently, the three clock pulses A1, A2, A3, are produced in sequence for defining the operation in the next frame, and thereupon the particular commands are being executed in the stated sequence, beginning, of course, with positioning one of the multiplexers 4 or 7, followed by analog-to-digital conversion, followed by formatting the proper data, and the selected date are fed to one side of the adder 10, whose resulting output is printed finally by the print command A3.

Proceeding now to the description of the formatting device 8, this circuit is included in the SPS 1 and serves for determining the width on strip 13 to be made available for the measuring values for the particular channels. It should be mentioned that multiple recorders have usually a total strip width of 240 millimeters, and data width or ranges to be made available are either the full width, half of the width, a quarter, etc. These standardized recording widths can be realized fairly simple within the system as described. The principle employed is a shift in position of the digital measuring value as applied from the A to D converter 5 to the formatting device 8. Moreover, the selector 9 may have a fixed number of lines, e.g. ten or nine, so that the formatting device 8 is the variable unit which specifically adapts the system to the maximum amplitude range.

By way of example, the analog-to-digital converter receives (it will be recalled) a normalized input, i.e., all of the analog signals applied have been normalized to vary within a particular range, and the thus fixed magnitude range may be associated with a particular resolution such as, for example, ten bits. As stated further, it was assumed that the recording comb has 512 electrodes. Consequently, the following recording widths can be obtained. Utilizing the full strip width and the 512 electrodes, the information is to be divided by two which, in effect, amounts to a shifting of the binary numbers to the right, dropping the least significant bit. A 120 mm or half scale recording width requires a division of the 10-bit number by 4 that is to say the digitized signals are shifted by two-bit positions, and the two least significant bits are dropped and so forth.

Generally speaking then, device 8 is, in effect, an interconnect device, such as a connection pattern on an interchangeable PC board, connecting, for example, the most significant bit line of converter 5 to the second most significant bit input line of circuit 9; the second of 5 to the third of 9 etc., dropping the least significant bit corresponding to a division by 2. A division by 4, as in the example above, connects the first of 5 to the third of nine etc., thereby dropping 2 least significant bits. This formatter may be of a variable one, a presettable one, or even a programmable one to obtain variations in the format and resolution of the data as available on the output side of the digitizer 5.

If the recorder is used as interference recorder, it is desirable to expand in time the presence of a disturbance. This is particularly important as one may wish to ascertain the beginning of the disturbance or interference. This can be accomplished in that upon detection of an interfering event, the strip 13 is moved and advanced faster. However, this advance cannot commence arbitrarily rapidly. Therefore, it is advisable to interpose a buffer at some place in the channel and this is the purpose of the buffer 33. Buffer 33 delays the data in between the acquisition and the recording so that the paper advance can be sped up sufficiently ahead of time. Separate detection of the alarm signal is needed to control the speed up of the strip 13.

The buffer 33 is, in effect, comprised of a series of shift registers SR-1 through SR-a, there being as many shift registers as different bit positions are, in fact, transferred between the devices 10 and 11 via the bus 29. The several shift registers are preferably clocked in parallel and one may use here conveniently the clock pulse A2. The recording will be delayed by as many frame periods as the shift registers have stages. Therefore, what was said above with regard to the association of particular clock pulses and acquisition frames has to be modified in that, in fact, the print clock pulse A3 does not cause the printout of the current measuring value as acquired but will record a value which was acquired many frame periods previously, depending on the number of stages of the buffer registers.

By way of example, the frame period may be 100 microseconds and it may be desirable to interpose a delay of 200 milliseconds. To permit the relatively slow speed up process for the strip 13 to take place, consequently, one will need about 2,000 acquisition frame periods as a delay which means that each shift register has to have about 2,000 bits, for example, $2^{11}$ (= 2048) bit positions. In the example mentioned above, of course, there will be nine shift registers if that is the chosen format. These buffers 33 are integrated circuits, and they are well available on the market. Interposition of such synchronously clocked registers has the advantage that there will be no additional errors introduced which previously used auxiliary equipment did incur. Another advantage is that the interposed delay is independent from the recording variance because only a single delay stage is, in fact, interposed being applicable to all channels.

The invention is not limited to the embodiments described above but all changes and modifications thereof not constituting departures from the spirit and scope of the invention are intended to be included.

We claim:

1. Recording device for recording a plurality of different input signals provided in a corresponding plurality of different channels, comprising a multiplexing means for sequentially scanning said input channels to obtain a cyclically repeated acquisition of said input signals;

an analog-to-digital conversion means having its input connected to an output of the multiplexing means for association with all of the channels of the plurality which provide analog signals, to obtain digitization thereof and to provide a train of digital signals;

means for providing signals representing fixed numbers, defining individual zero scale levels for recording the digitized input signals;

an adder connected for receiving the digital signals from the multiplexing means and as digitized and said fixed numbers to obtain an added output;

means connected to multiplexing means and the means for providing, to operate them in synchronism with each other;

a one-out-of-n decoder connected to the adder for receiving the output thereof, n being an integer, the decoder having n output channels accordingly;

a plurality of altogether n- recording means respectively connected to the n output channels of the decoder for being individually operated by the decoder output channels; and a recording medium moving relative to the recording means to obtain print dots upon operation of the respective recording means.

2. Recording device as in claim 1, wherein the multiplexing means includes separate multiplexers for analog channels and for pulse signal channels, the conversion means being connected to the multiplexer for the analog channels, the multiplexing means further including selection means to selectively apply the multiplexed channels or the output of the conversion means to the adder.

3. Recording device as in claim 1, and including program means for controlling the multiplexing means to obtain interrogation of all said input channels in cyclic repetition, said program means further providing the fixed numbers in the sequence of multiplexing.

4. Recording device as in claim 3, including a recycling program counter and an addressable memory connected for being accessed by the counter to obtain sequential readout of information in accordance with the operation and as accessed by the counter, each such information including control information for operating the multiplexing means and one of the fixed numbers; and timing means for sequentially applying the information as read from memory to the multiplexing means and to the adder.

5. A recording device as in claim 4, said memory including an output bus for distributing the content of a readout memory location upon being accessed by the counter, to the multiplexing means and to the adder, the programs means including timing means to cause sequential operation of the multiplexing means of the conversion means, and of the recording means.

6. A recording device as in claim 1, including a buffer interposed between the adder and the decoder to obtain a timed delay between acquisition and printing.

7. The recording device as in claim 1, wherein said n dot recording means is comprised of a plurality of n electrodes arranged in a row, the recording medium being a metallized strip, and means for applying a voltage between the respective energized electrode and the metallized strip to obtain printing.

8. A recording device as in claim 1 and including an exchangeable formatting circuit dividing the scale of the number defined by the conversion means for adapting the range to a particular portion of the recording medium.

* * * * *